May 30, 1967 N. C. HEKIMIAN 3,323,043

CAPACITOR TESTING DEVICE USING A PHASE LOCKED LOOP

Filed May 8, 1964

INVENTOR
NORRIS C. HEKIMIAN
BY John J. Byrne
ATTORNEY

United States Patent Office 3,323,043

Patented May 30, 1967

3,323,043
CAPACITOR TESTING DEVICE USING A PHASE LOCKED LOOP

Norris C. Hekimian, Kensington, Md., assignor to Page Communications Engineering, Inc., Washington, D.C., a corporation of Delaware Filed May 8, 1964, Ser. No. 365,878
3 Claims. (Cl. 324—57)

This invention relates to a method of measuring leakages in capacitors and more particularly to a rapid method of measuring small leakages of large capacitors through the use of a phase locked loop.

At the present time, leakage of large capacitors is determined either by measurement of charge decay or by allowing a steady state condition to be reached with a large series resistor. Both of these methods are extremely time consuming.

Accordingly, it is an object of this invention to provide a simplified means for testing the leakage of capacitors.

Another object of this invention is to provide a means for testing the leakage of large capacitors in a relatively short period of time.

Yet another object of this invention is to provide a means for measuring small leakages of large capacitors through the use of a phase locked loop.

These and other objects of my invention will be understood from the following description together with the drawings, wherein.

Figure 1:
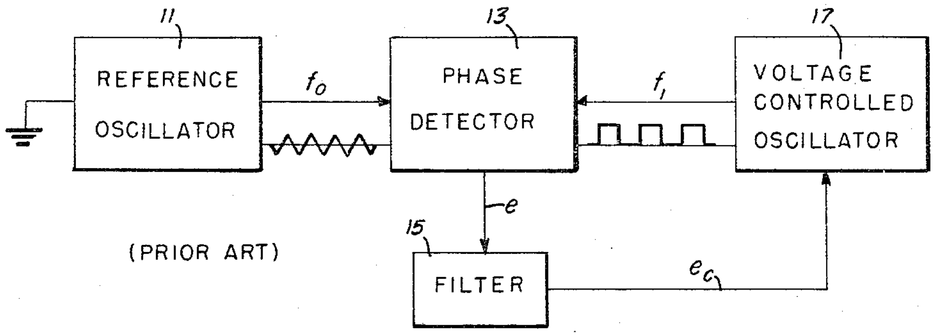
FIG. 1 is a schematic diagram of a phase locked loop.

Referring now specifically to FIG. 1, there is shown a basic phase locked oscillator having an input from a reference oscillator 11. This input has a frequency $f_0$ and a sawtooth waveform. With no other input, the phase detector 13 has an output voltage $e$ to filter 15. Any of the well known RC filter networks may be used in this system. Filter 15 averages or integrates the voltage $e$ and provides an output control voltage $e_c$ which determines the output of the voltage controlled oscillator 17. Oscillator 17 has an output frequency $f_1$ and a square waveform. The outputs of oscillator 11 and oscillator 17 are mixed in the phase detector 13.

If the two signals are in phase, the phase detector output is a function having equal areas in the positive and negative regions. Putting this signal through filter 15 will yield a zero output, $e_c=0$. However, when one signal shifts relative to the other, the output of the phase detector will have a pronounced D.C. component. Therefore, the filter will yield a non-zero output voltage $e_c$ which acts as a control voltage signal on the voltage controlled oscillator 17 to readjust the output therefrom. This alters the phase so as to return oscillator 17 to in-phase condition with oscillator 11. Actually, the filter 15 locks $f_1$ with $f_0$ and the loop will stay in this phase locked condition.

The resulting phase bandwith is exactly equivalent to the D.C. baseband bandwidth. Using a conventional doublebreak RC filter provides a long time constant network which contributes very little to the response speed whereas any shunt conductance will contribute significantly to the residual or steady state phase detector error voltage. Since the voltage controlled oscillator 17 is a perfect integrator, in phase output, of the control voltage $e_c$, there can be no change in the D.C. value of $e_c$ so long as phase lock is maintained to a constant frequency reference. Only an impulse effect is permissible since the voltage controlled oscillator output phase is in exact integral of the control voltage $e_c$.

Figure 2:
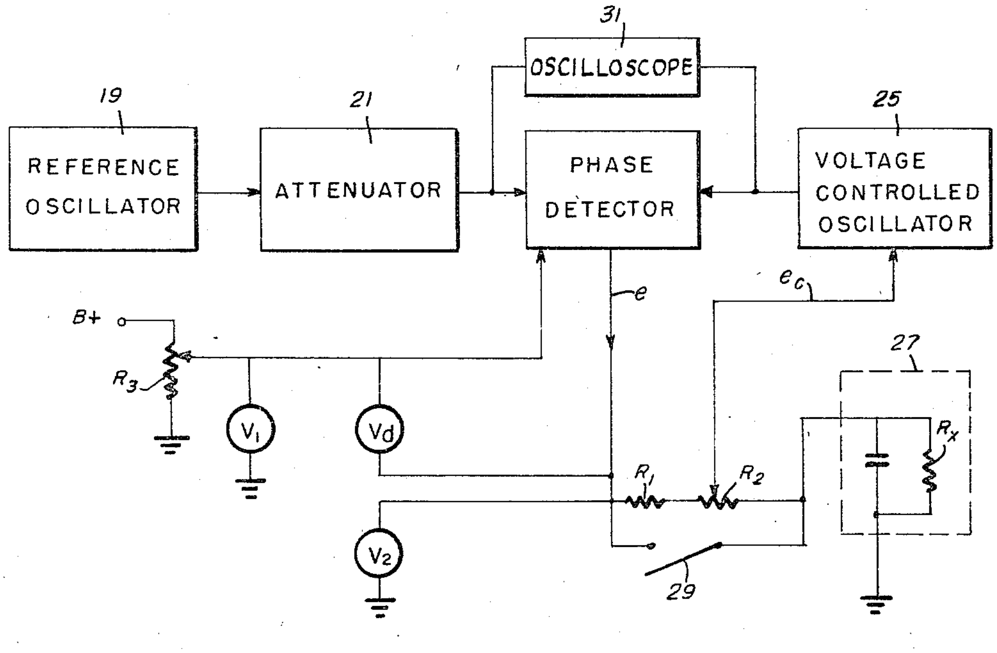
FIG. 2 is a schematic of a preferred embodiment of my invention using the basic phase locked loop.

FIG. 2 shows a preferred basic circuit used in the present invention. This circuit employs a varactor controlled VCO 25 in order to provide a very high input impedance. The reference oscillator input may be controlled in order to permit loop stability control. Potentiometer $R_2$ is adjusted for the desired damping factor. It should be noted that since this is a large-signal system, the usual requirements for noise-bandwidth minimization do not apply and only loop stability and adequately large bandwidth are required. Therefore, the damping adjustment of $R_2$ is non-critical.

It can be seen that the basic phase locked loop of FIG. 1 is still used. The output of the reference oscillator 19 is passed through attenuator 21 to the phase detector 23. The output $e$ passes through the resistive network R, and $R_2$ to VCO 25. The test capacitor having the unknown conductance $R_x$ is coupled to resistance $R_2$. A switch 29 provides a direct connector between the output of the phase detector 23 and the test capacitor 27.

The bias voltage for phase detector 26 is provided through adjustable resistor $R_3$. The three meters $V_1$, $V_2$ and $V_d$ are connected as shown for measuring purposes which will be explained in connection with procedure to be followed.

It should be noted that the linearity of VCO control and of the phase detector characteristics do not influence the accuracy of measurement at all, since this procedure is a true "slide-back" or voltage substitution measurement. Accuracy is affected only by the stability of the meter $V_1$, the resistances R, $R_2$, $R_x$, and the high varactor input resistance.

Additionally, for poor capacitors, the attenuation and resulting required phase detector voltage cannot exceed the available phase detector output or else the phase lock will be broken and no measurement can be made.

The procedure used for measuring the leakage of the capacitor is as follows. With the switch 29 closed, the frequency of oscillator 25 is adjusted by varying $R_3$ with the resultant bias voltage being read on meter $V_1$ and by tuning the oscillator directly so that phase lock is achieved. This procedure sets up the initial charge on the unknown to avoid the severe transient effect that would occur if an uncharged capacitor was inserted in a locked loop.

Switch 29 is then opened and meter $V_d$ is read, making certain that lock still exists. The ratio of $V_d$ to $V_1$ is equal to the ratio of $R_1+R_2$ to $R_x$. Therefore, $R_2$ may be found by the equation $$R_x=\frac{V_1(R_1+R_2)}{V_d}$$

Alternately, a single voltmeter $V_2$ at the junction of switch 29 and the output of phase detector 23 can be used to give the output reading $V_d+V_1$ with the switch open and closed. The difference between the open and closed reading divided by the closed switch reading will give the same result as the above equation.

An oscilloscope 31 may be provided to monitor the output of oscillator 19 and oscillator 25 in a Lissajous pattern. If the loop is in locked operation, the oscilloscope shows a stationary ellipse or line. If the loop is in unlocked operation, the oscilloscope will show a "smear."

It is to be understood that the specification and drawings are illustrative of a preferred embodiment of the invention. Specific components of the system could be replaced with equivalent components and waveforms without departing from the scope of the invention so long as the basic phase locked loop is used.

I claim:

1. A circuit for the measurement of the resistive components of a capacitor comprising a phase detector, a reference oscillator providing a first input to said phase detector, a voltage controlled oscillator providing a second input to said phase detector, adjustable resistance means coupling the output of said phase detector to the input of the voltage controlled oscillator, switching means connected in parallel with said resistance means, junction means between one side of said switching means and the input of said voltage controlled oscillator, means for coupling said capacitor between said junction means and ground, second junction means coupling the other side of said switching means to the output of said phase detector, and metering means coupled to said second junction means for measuring the voltage at said second junction with said switch open and closed.

2. A circuit for the measurement of the resistive components of a capacitor comprising a reference oscillator, a voltage controlled oscillator, a phase detector coupled between said reference oscillator and said voltage controlled oscillator and having a voltage output substantially proportional to the degree of phase shift between the signal outputs of said oscillators, an impedance network connected between the output of said phase detector and the input of said voltage controlled oscillator, switch means having one side thereof coupled to the input of said voltage controlled oscillator, said capacitor being coupled between ground and a first junction between said voltage controlled oscillator and said one side of said switching means, a second junction connecting the other side of said switch means to the output of said phase detector, and meter means coupled to said second junction for measuring the voltage at said second junction with said switch opened and closed.

3. A circuit for the measurement of the resistive components of a capacitor comprising a reference oscillator, a phase detector, a voltage controlled oscillator, a fixed and a variable resistor connected in series between said phase detector and said voltage controlled oscillator and an attenuator coupled between said reference oscillator and said phase detector, switch means connected across said resistors, meter means coupled between the other side of said switch and ground for measuring the circuit voltage with said switch open and closed.

References Cited

UNITED STATES PATENTS

| | | | |
|---|---|---|---|
| 2,541,454 | 2/1951 | White et al. | 331—12 X |
| 2,851,658 | 9/1958 | Howson | 324—57 |
| 3,034,054 | 5/1962 | Brisbane | 324—82 X |
| 3,119,062 | 1/1964 | Codd | 324—48 X |
| 3,164,777 | 1/1965 | Guanella | 324—82 X |

WALTER L. CARLSON, *Primary Examiner.*

E. E. KUBASIEWICZ, *Assistant Examiner.*